(12) United States Patent
Takahara et al.

(10) Patent No.: US 6,334,405 B1
(45) Date of Patent: Jan. 1, 2002

(54) VACUUM ARC EVAPORATION SOURCE AND VACUUM ARC VAPOR DEPOSITION APPARATUS

(75) Inventors: Kazuki Takahara; Hirofumi Fujii, both of Takasago (JP)

(73) Assignee: Kobe Steel, Ltd., Kobe (JP)

( * ) Notice: Subject to any disclaimer, the term of this patent is extended or adjusted under 35 U.S.C. 154(b) by 0 days.

(21) Appl. No.: 09/480,164

(22) Filed: Jan. 10, 2000

(30) Foreign Application Priority Data

Jan. 14, 1999 (JP) .......................................... 11-008045
May 21, 1999 (JP) .......................................... 11-142073

(51) Int. Cl.[7] .......................... C23C 16/00; C23C 14/35
(52) U.S. Cl. ................ 118/723 VE; 118/726; 204/192.12
(58) Field of Search .................... 118/723 VE, 715, 118/716, 726; 204/298.16, 298.41, 192.12; 315/111.41; 427/540

(56) References Cited

U.S. PATENT DOCUMENTS 5,433,836 A  *  7/1995  Martin et al. .......... 204/298.41
5,597,459 A  *  1/1997  Altshuler ............... 204/192.12

FOREIGN PATENT DOCUMENTS

| DE | 40 22 308 | 1/1991 |
| EP | 0 495 447 | 7/1992 |
| EP | 0 511 153 | 10/1992 |
| JP | 2-194167 | 7/1990 |

OTHER PUBLICATIONS

L.P. Sablev, et al., Instrument and Experimental Techniques, vol. 19, No. 4, pp. 1211–1213, "Electrical–Arc Vaporizer of Metals with Magnetic Confinement of Cathode Spot," Jul. 8, 1976.

* cited by examiner

Primary Examiner—Gregory Mills
Assistant Examiner—P. Hassanzadeh
(74) Attorney, Agent, or Firm—Oblon, Spivak, McClelland, Maier & Neustadt, P.C.

(57) ABSTRACT

To provide an evaporation source and an arc evaporation apparatus in which an evaporation material as a cathode of arc discharge, and a magnetic field generating source arranged so that all lines of magnetic force crossing the evaporation surface of the evaporation material cross substantially vertically are arranged whereby the number of molten particles arriving at a substrate by the magnetic field can be reduced, and deviation of occurrence of arc spots can be suppressed.

10 Claims, 16 Drawing Sheets

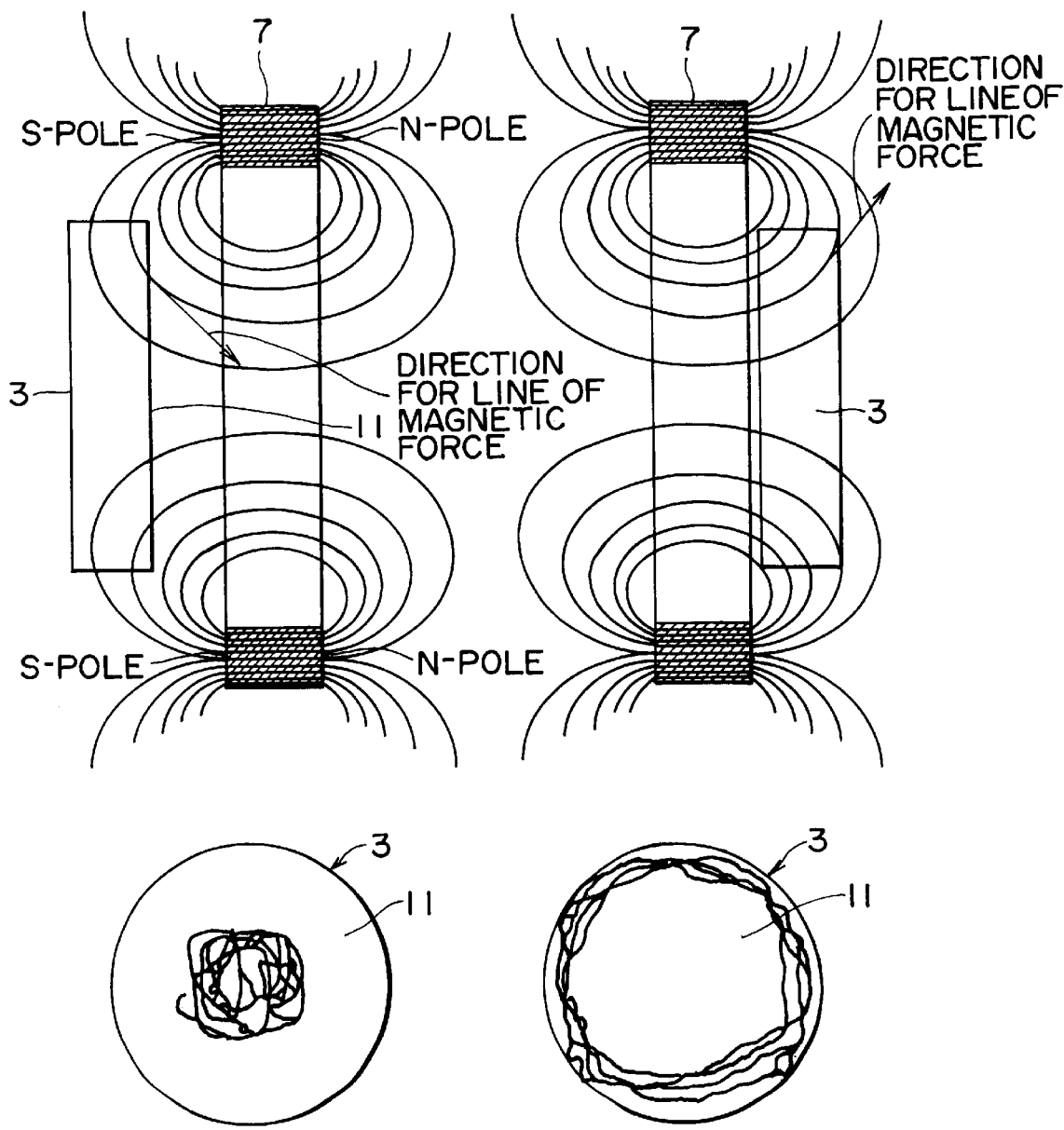

TO ANODE

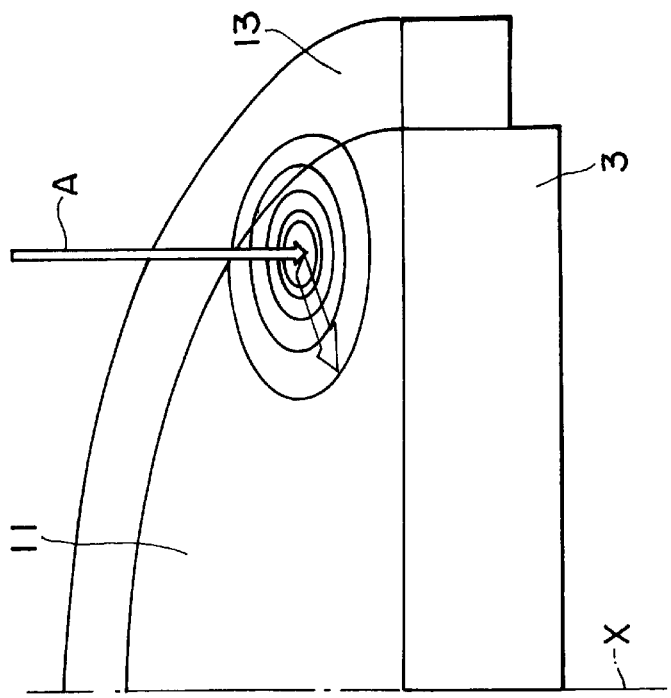
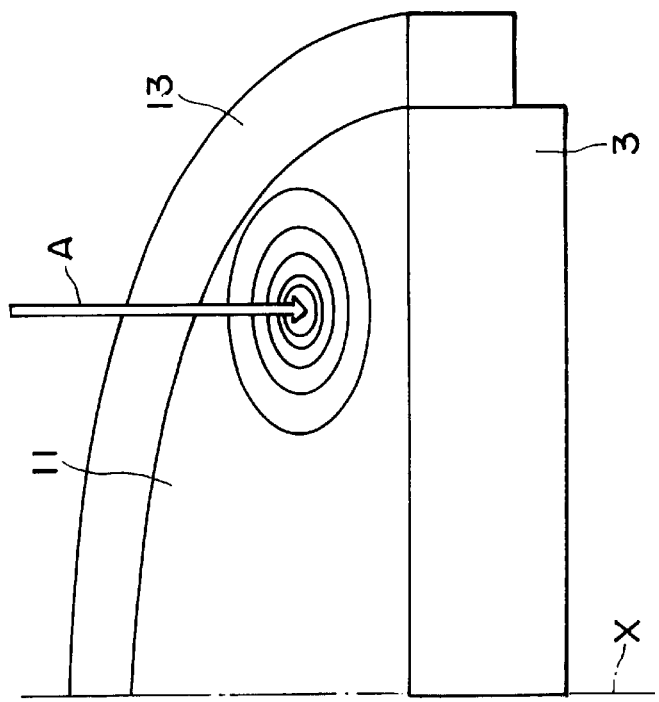

VACUUM ARC EVAPORATION SOURCE AND VACUUM ARC VAPOR DEPOSITION APPARATUS

TECHNICAL FIELD OF THE INVENTION

The present invention relates to a vacuum arc evaporation source and a vacuum arc vapor deposition apparatus provided with the vacuum arc evaporation source.

BACKGROUND OF THE INVENTION

A vacuum arc vapor deposition apparatus has been heretofore known in which an arc discharge with an evaporation material being a cathode is generated in a vacuum chamber, and a cathode material is evaporated and ionized by energy of an arc current to accumulate films on a substrate.

Such a vacuum arc evaporation apparatus has a disadvantage that molten particles having a diameter in excess of a few $\mu$m which is far larger than that of evaporated particles and ionized particles are unavoidably generated, which are mixed into films, resulting in deterioration of coarseness of film surface and unevenness of film composition.

There has been proposed to solve such a problem caused by the molten particles as described above by generation of a magnetic field. For example, in Japanese Patent Application Laid-Open No. 2-194167 Publication is disclosed that an air-core coil coaxial with an evaporation surface is provided between the evaporation surface and a substrate. According to the constitution disclosed therein, electrons in a plasma are wound around the line of magnetic force caused by the air-core coil and flow along the line of magnetic force while performing a turning movement so that the plasma arrives at the substrate. On the other hand, the aforesaid induction effect does not act on neutral molten particles, and ions are selectively guided to the substrate, because of which the number of molten particles relatively moving toward the substrate cannot be reduced.

However, in the case of the aforementioned technique, the coil is provided in an intermediate position between the substrate and the evaporation surface, and the magnetic field caused by the coil acts so as to move inwardly in the radial direction of the evaporation surface. In this case, an arc spot tends to move closer to the center of the evaporation surface, and the evaporation materials are not consumed uniformly. Furthermore, where a plurality of evaporation sources are provided in a vacuum container, there is an undesirable influence from other evaporation sources since the magnetic field is extensive.

SUMMARY OF THE INVENTION

The present invention has been accomplished in view of circumstances as described above. It is an object of the present invention to provide an evaporation source capable of reducing the number of molten particles arriving at a substrate by a magnetic field, and capable of reducing the unbalance of occurrence of arc spots.

For achieving the aforementioned object, the present invention has taken the following technical means. That is, the feature of a vacuum arc evaporation source according to the present invention, lies in the provision of an evaporation material as a cathode of arc discharge, and a magnetic field generating source arranged so that a magnetic field generating source surrounds the evaporation material, and all the lines of magnetic force crossing the evaporation surface of the evaporation material crosses substantially vertically to the evaporation surface.

According to the constitution as mentioned above, molten particles can be reduced similar to the prior art by the lines of magnetic force crossing the evaporation surface. Since the lines of magnetic force substantially vertically cross the evaporation surface, unlike the prior art, the arc spot is hard to be deviated on the evaporation surface, and the evaporation material is uniformly consumed.

The lines of magnetic force need not cross the evaporation surface completely vertically, but may cross the evaporation surface substantially vertically. The substantially vertical termed in the present invention indicates within ±30 degrees with respect to normal line of the evaporation surface. If in the range as described, this is within an allowable range capable of achieving uniform consumption of the evaporation material to some extent. Accordingly, the magnetic field generating source may be arranged at a position so that the lines of magnetic force assume a direction as described.

Preferably, the magnetic field generating source is arranged so that the direction of the lines of magnetic force in the evaporation surface is within ±10 degrees with respect to normal line of the evaporation surface. In this case, the evaporation material can be consumed more uniformly.

The magnetic force generating source according to the present invention may be a permanent magnet, an electromagnet or coil wound around the outer periphery of the evaporation material. Preferably, a permanent magnet is used as a magnetic field generating source in view of miniaturization of apparatus.

As the specific constitution of a magnetic field generating source for causing lines of magnetic force to cross the evaporation surface substantially vertically, suitably, the magnetic field generating source is arranged so that the evaporation surface is positioned at an intermediate position between both N and S poles of the magnetic field generating source.

The intermediate position between both the N and S poles need not be central between both the magnetic poles. However, if the magnetic field generating source is arranged so that the evaporation surface is positioned at substantially central position between both the N and S poles, the direction of the lines of magnetic force further tends to register with the normal direction of the evaporation surface, which more suitable.

Preferably, the magnet comprises an in-diametral magnetic field generating source surrounding the evaporation material, an out-diametral magnetic field generating source surrounding the in-diametral magnetic field generating source so that the same axial and same pole as the in-diametral magnetic field generating source are directed in the same direction. In this case, the number of lines of magnetic force extending through the evaporation material increases, that is, the intensity of magnetic field becomes high to obtain the aforementioned effect more strongly.

Further, according to the present invention, the magnetic force generating source may comprise a first magnetic field generating source having magnetic poles on the inner peripheral side and on the outer peripheral side, and a second magnetic field generating source in which magnetic poles on the inner peripheral side and on the outer peripheral side are different from those of the first magnetic field generating source and arranged in an axial direction of the first magnetic field generating source.

According to the constitution as described above, extension of the magnetic field generating source in an axial direction is small, which is preferable. In this case, if the outer peripheral sides of the first magnetic field generating source and the second magnetic field generating source are connected by a magnetic material, extension of the magnetic field sideward is rarely present, and so, where a plurality of evaporation sources according to the present invention are provided in a vacuum container, an influence of next evaporation source can be eliminated.

Further, for obtaining the similar effect, the magnetic field generating source may be constituted as a permanent magnet having a U-shape in section having both N and S magnetic poles on the in-diametral side.

In the more preferable constitution according to the present invention, there comprises the magnetic material surrounding the outer periphery of the evaporation material. The magnetic material draws the lines of magnetic force and consequently lines of magnetic force formed by this magnetic field generating sources are inclined somewhat in the outer peripheral direction. An arc has character that the arc tends to move in an inclining direction of lines of magnetic force, in which case, an arc spot is affected by the lines of magnetic force inclined in the outer circumferential direction, and moves in the outer circumferential direction. Thereby, the arc spot approached the outer peripheral portion of the evaporation surface is pushed back to the center of the evaporation surface to obtain a further stronger arc confining effect.

Preferably, between the evaporation material and the magnetic material is provided an insulator for electrically insulating both the materials. When the magnetic material is not insulated from the evaporation surface and both have the same potential, there is the possibility that the arc spot moves from the evaporation surface to the magnetic material, which can be, however, prevented passively by the provision of the insulator.

As the insulator, an insulating material can be interposed between the outer periphery of the evaporation material and the inner periphery of the magnetic material, but the insulator preferably comprises a clearance capable of insulating the evaporation material and the magnetic material. When as the insulator, a member (an insulating element) is provided between the evaporation material and the magnetic material, the evaporation material is evaporated and adhered to the member, resulting in a possible occurrence of inferior insulation. However, if the insulator is constituted as a clearance, such a possible adhesion disappears and the inferior insulation is prevented.

More preferably, a direction changing means for changing lines of magnetic force to a direction inclined on the peripheral edge with respect to normal line formed on the evaporation surface is provided in the vicinity of a central portion of the evaporation material. Thereby, concentration of arc on the central portion of the evaporation surface is prevented, resulting in uniform consumption.

Means for imparting a change to a direction of lines of magnetic force from the magnetic field generating source that can be employed includes a magnet, a coil or a magnetic material. When the magnet, the coil or the magnetic material is arranged on the back side of the central portion of the evaporation material, the lines of magnetic force in the vicinity of the center are drawn to the magnet, the coil or the magnetic material, whereby the lines of magnetic force in the vicinity of the center are inclined outward with respect to normal line. When the central lines of magnetic force are inclined outward, concentration of arcs on the central portion of the evaporation surface is prevented, due to the characteristic that the arc tends to move in the inclining direction of lines of magnetic force, and uniform consumption results.

A horizontal magnetic force component is generated on the evaporation surface by inclination of lines of magnetic force whereby the arc spot rotates, but its region is enlarged so that inclination is large to make it possible to make the moving rate of the arc spot high in a wide range, as a consequence of which a local rise in temperature of the evaporation material is suppressed and occurrence of droplets reduces. Further, when a magnet or a coil is used as the line of magnetic force direction changing means, magnetic flux density becomes high, thus making it possible to make the moving rate of the arc spot high, and to further prevent higher temperature.

According to the vacuum vapor deposition apparatus in which the evaporation source is provided in the vacuum container, an accidental fire of arc can be prevented to provide efficient operation, and reduction in droplets enables formation of films of high quantity.

BRIEF DESCRIPTION OF THE DRAWINGS

FIGS. 6A and 6B are respectively sectional side views showing an evaporation source as a comparative example relative to the present invention, 6A being showing that the line of magnetic force is inward, 6B being showing that the line of magnetic force is outward;

FIGS. 14A–14B is a perspective view showing arc repulsion behavior caused by the annular magnetic material surrounding the outer periphery of the evaporation material;

DETAILED DESCRIPTION OF THE PREFERRED EMBODIMENTS

Figure 1:
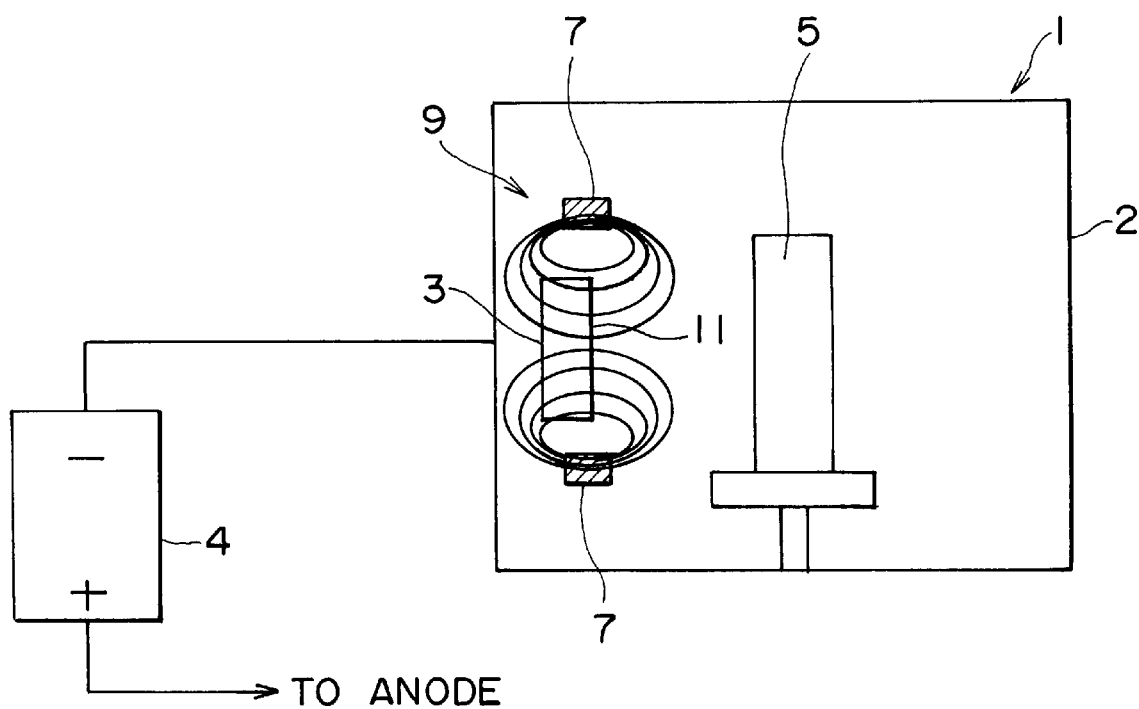
FIG. 1 is a schematic constituent view of a vacuum arc vapor deposition apparatus according to a first embodiment of the present invention.
Figure 2:
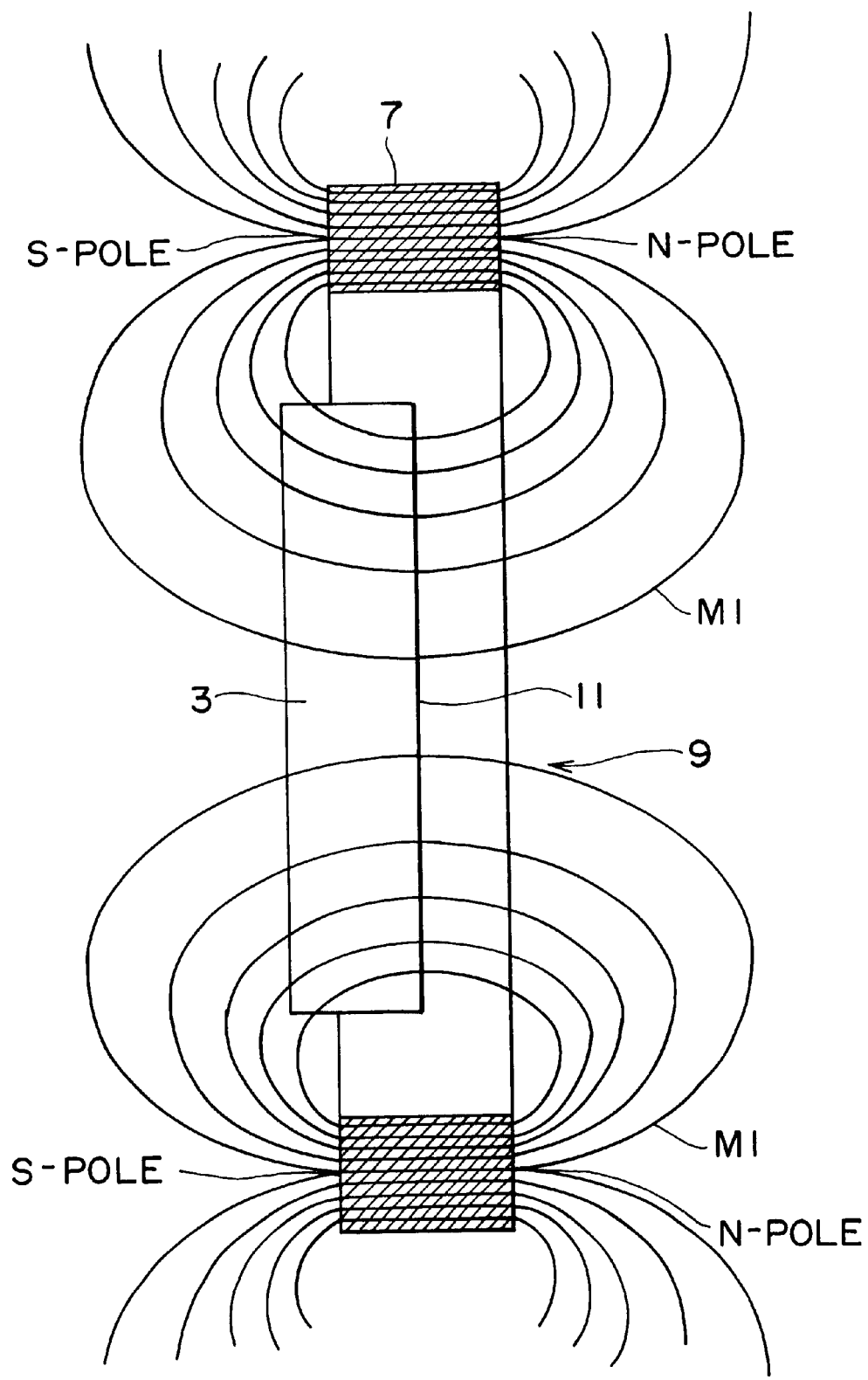
FIG. 2 is a sectional side view of an evaporation source according to a first embodiment of the present invention.
Figure 3:
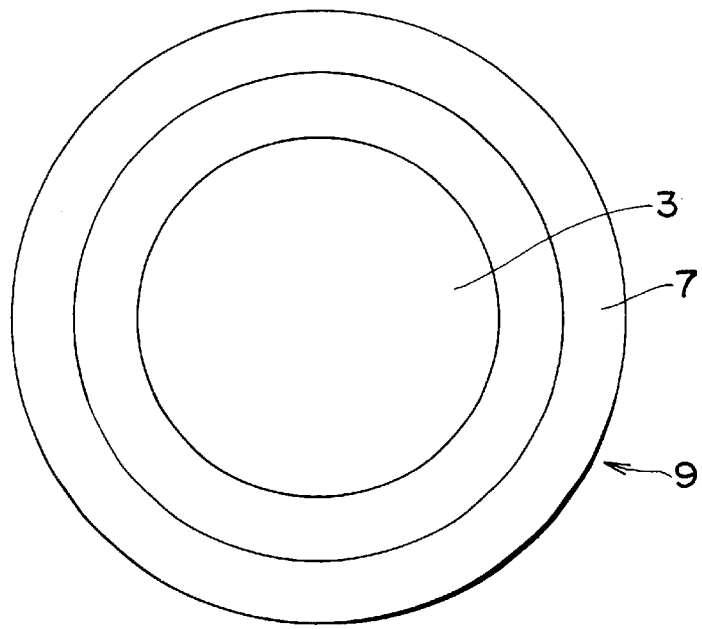
FIG. 3 is a front view of the evaporation source according to the first embodiment of the present invention.

Modes for carrying out the present invention will be described hereinafter with reference to the drawings. FIGS. 1 to 3 show a first embodiment of the present invention. As shown in FIG. 1, a vacuum arc vapor deposition apparatus 1 is so constituted that an evaporation material 3 as a cathode is provided within a vacuum container 2, an arc discharge is generated between the former and an anode not shown by an arc discharge power supply 4 to evaporate and ionize the evaporation material 3, and films are accumulated on a coating substance to be processed (substrate) 5.

The evaporation materials 3 constitutes a single evaporation source unit 9 together with a magnetic field generating source 7 for generating a magnetic field crossing substantially vertical to the evaporation surface of the evaporation material 3. While in FIG. 1, there is illustrated a single magnetic field generating source unit 9 provided in the vacuum container 2, it is preferable that a plurality of the sources 9 are provided on the side walls of the vacuum container 2 so as to surround the coating substance to be processed 5.

As shown in FIG. 3, the evaporation material 3 is formed like a disk, and the surface thereof on the coating substance to be processed 5 side is the arc evaporation surface 11. The magnetic field generating source 7 constituting an evaporation source 9 together with the evaporation material 3 comprises an annular permanent magnet having annular magnetic poles on both ends in an axial direction (in a thickness direction). The magnetic field generating source 7 is arranged so as to surround the evaporation material 3 coaxial with the evaporation material 3. The magnetic field generating source 7 is arranged so that an axial central position thereof is substantially registered with a position of the evaporation surface, an end on the coating substance to be processed 5 side (the forward surface) being N-pole, the other end being S-pole. Note that the magnetic poles may be reversed. The thus arranged magnetic field generating source 7 generates a magnetic field as shown in FIG. 2.

Figure 4:
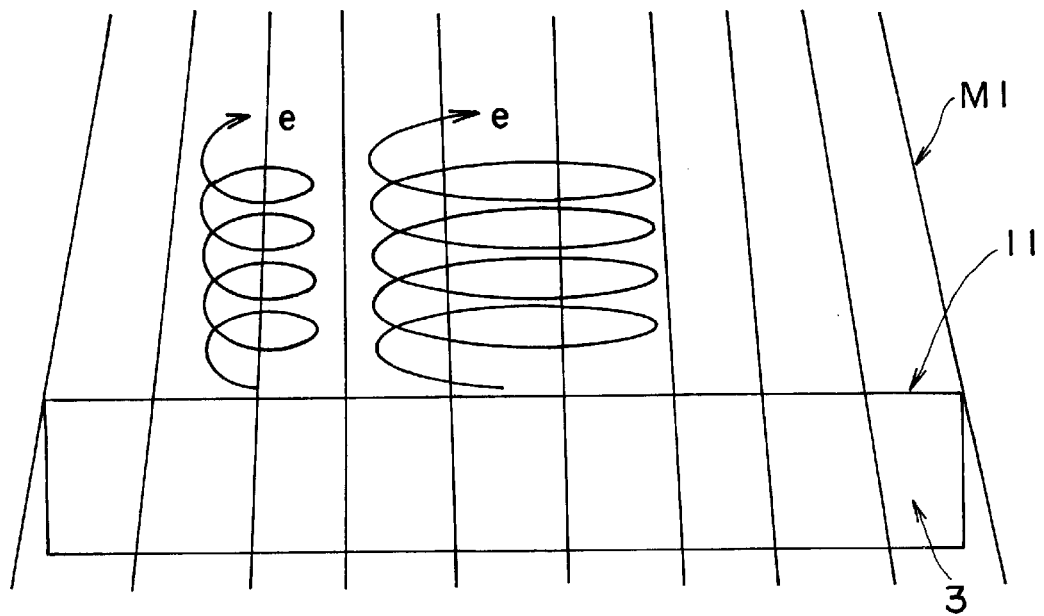
FIG. 4 is a view showing a flying route of electrons from the evaporation source in the present invention.
Figure 5A:
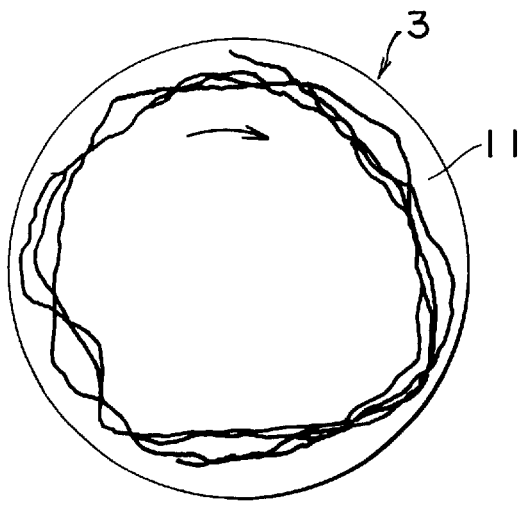
FIGS. 5A–5D is an imaginary view showing a locus of arc spots on the evaporation surface in the present invention.
Figure 5B:
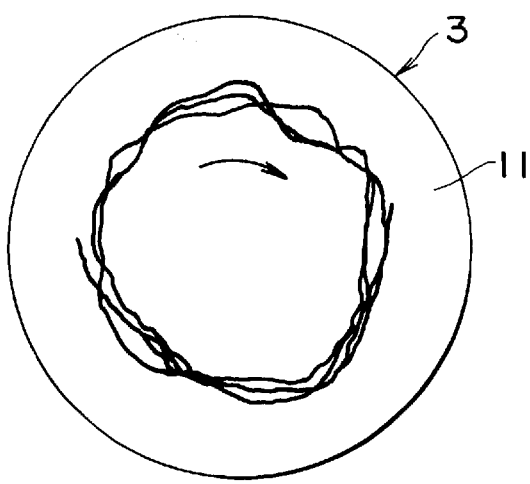
Figure 5C:
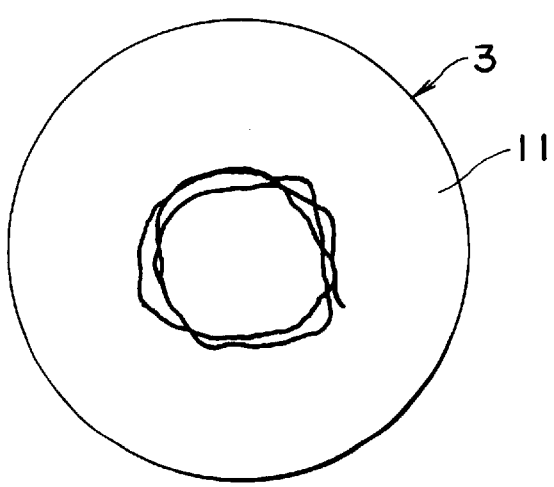
Figure 5D:
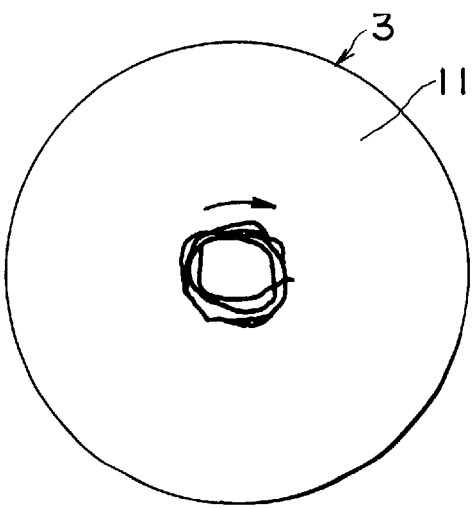

Further, where a permanent magnet is employed as the magnetic field generating source 7, it is large in magnetic field strength as a magnetic field generating source of the same volume as compared with a coil. Accordingly, since the evaporation surface and the flying route for evaporated particles are put on an area which is large in magnetic field strength, as shown in FIG. 4, a helical movement where charging particles evaporated from the evaporation material 3 fly along the lines of magnetic force while being twined round the lines of magnetic force becomes active. Thereby, activation of the film forming particle evaporated from the evaporation material 3 and reaction gas is promoted to obtain a film which is large in close contact force and is fine. The radius of the helical movement of the charging particles is determined according to the speed of the charging particles and the magnetic field strength, and flying of the charging particles is a gathering of a variety of radial helical flying.

FIGS. 5a to 5d respectively show images of loci of arc spots on the evaporation surface 11 in the present invention. Patterns of FIGS. 5a to 5d appear at random moment by moment. The respective patterns are alike rotating movements, and are different in their rotating radius. When the line of magnetic force is substantially vertical to the evaporation surface 11, since the loci of arc spots are the rotating movements different in radius moment by moment as described above, an evaporation position changes and the consumption of the evaporation surface is uniform as compared with the case where the radius of the rotating movement is constant. Accordingly, the evaporation surface consumes while maintaining a state close to parallelism with the evaporation surface as a new one, and the utility efficiency of the evaporation material is very high. It is noted that the direction of the rotating movement is reversed according to the direction of the line of magnetic force.

Further, since the rotating radius of the arc spot varies at random, a local rise in temperature of the evaporation material is suppressed, and generation of molten particles is suppressed.

FIG. 6 shows, as a comparative example, images of arc spots where a line of magnetic force is greatly inclined from a normal direction of the evaporation surface 11. When as shown in FIG. 6A, the magnetic field generating source 7 is greatly deviated forward (the coating substance to be processed 5 side) relative to the evaporation surface 11 of the evaporation substance 3, the line of magnetic force is greatly inclined inward in the evaporation surface 11. Accordingly, the arc spot is discharged concentratively in the central part of the evaporation surface 11.

On the other hand, when it is greatly deviated backward as shown in FIG. 6B, the line of magnetic force in the evaporation surface is greatly inclined outward. Accordingly, the arc spot is discharged only at the side edge portion of the evaporation surface 11, and the arc spot is flied out of the evaporation substance 3 and the arc discharge tends to stop. In both case of FIGS. 6A and 6B, the evaporation materials 3 is not uniformly consumed, and the utility efficiency is poor.

It is preferable for preventing such an inconvenience as noted above to make the direction of the line of magnetic force on the evaporation surface 11 within ±30 degrees with respect to the normal line of the evaporation surface, more preferably, the evaporation substance 3 and the magnetic field generating source 7 are arranged so as to be within ±30 degrees. Further, most preferably, the line of magnetic force is vertical to the evaporation surface 11, but preferably, the evaporation source unit 9 is manufactured in a state where the evaporation surface 11 is positioned some what forward from the axial center of the magnetic field generating source 7. In this case, when the evaporation material 2 is consumed to some extent so that the evaporation surface 11 is retreated, the axial center of the magnetic field generating source 7 is registered with the position of the evaporation surface 11, and even if the evaporation material 3 is further consumed, the evaporation surface 11 is merely positioned somewhat rearward from the axial center of the magnetic field generating source 7, to thereby obtain a state that the line of magnetic force is always substantially vertical to the evaporation surface till the evaporation material 3 consumes from its new one.

Figure 7A:
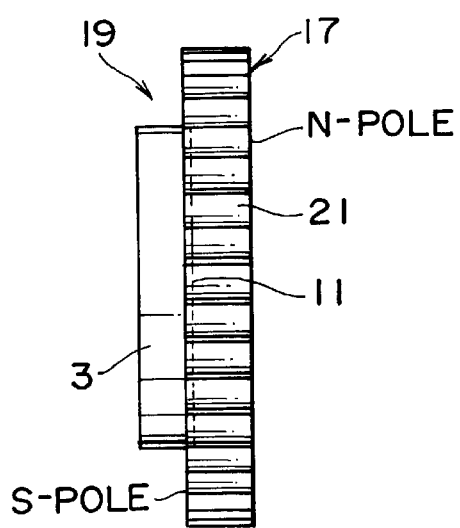
FIGS. 7a and 7b show respectively evaporation sources according to a second embodiment of the present invention, 7a being a side view, 8b being a front view.
Figure 7B:
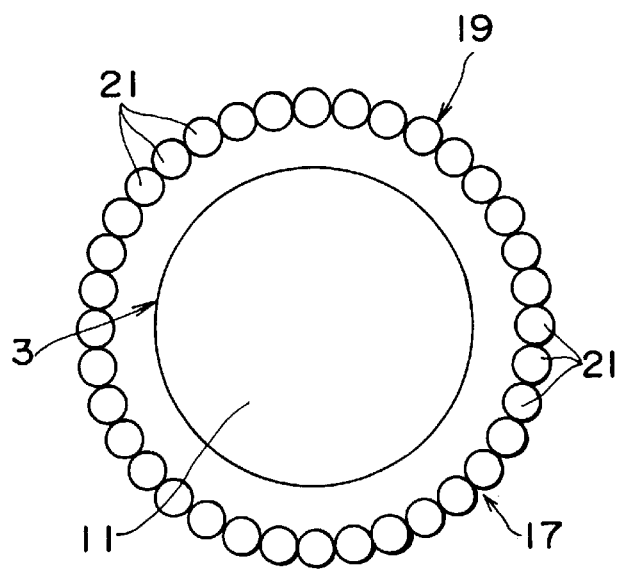

FIG. 7 shows an evaporation source 19 according to a second embodiment of the present invention. A magnetic field generating source 17 of the evaporation source 19 is so constituted that a number of permanent magnets 21 are annularly put side by side whereby a magnetic field similar to the magnetic field generating source 7 according to the first embodiment is generated. That is, a plurality of bar magnets 21 having magnetic poles on both ends in a longitudinal direction are arranged annularly with the directions of magnetic poles put in order to constitute annular magnets having annular magnetic poles on both ends in an axial direction. The magnetic field generating source 17 is arranged similarly to the magnetic field generating source 7 according to the first embodiment, and operates with respect to the evaporation substance 3 similarly to the first embodiment.

Figure 8:
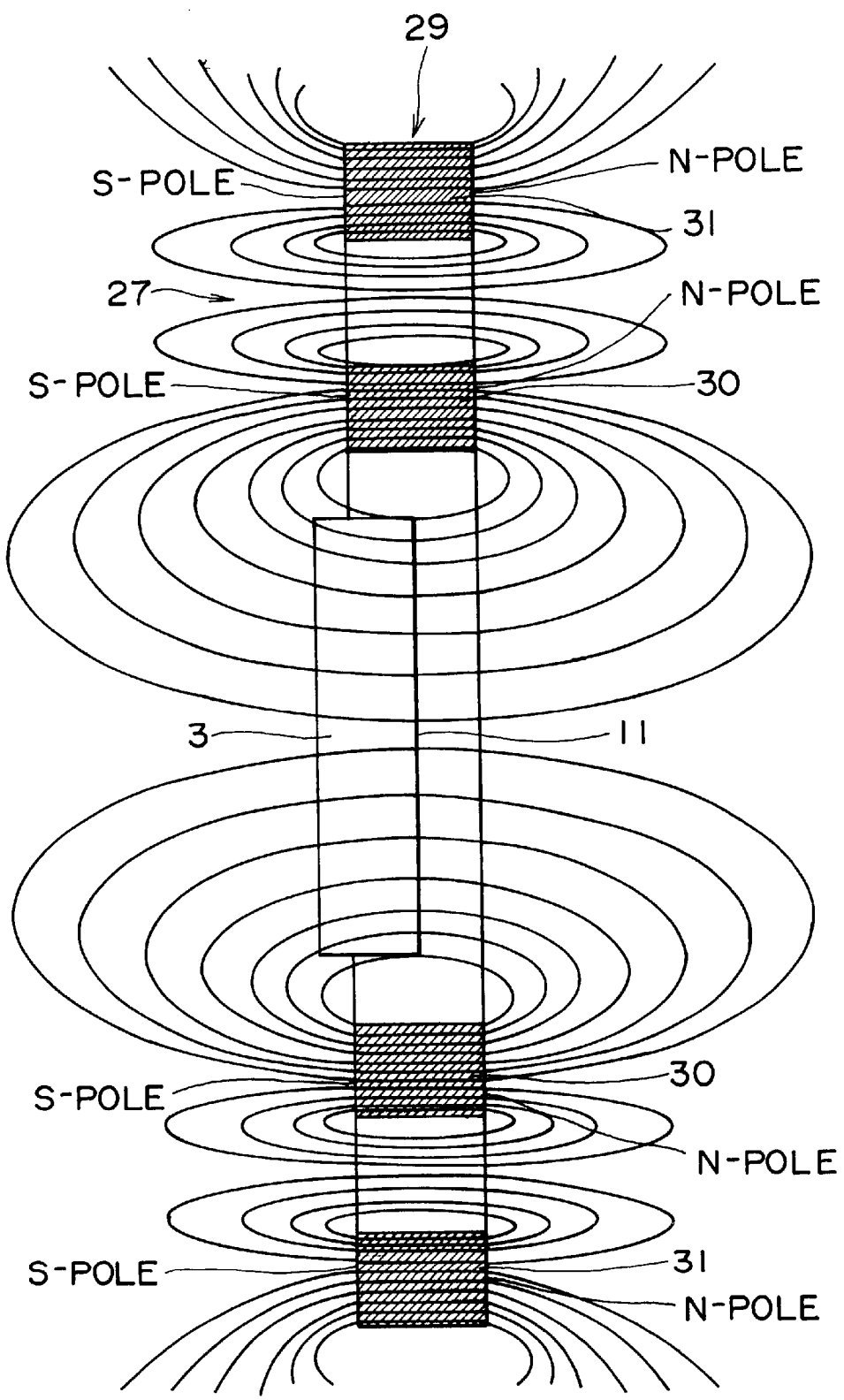
FIG. 8 is a sectional side view showing an evaporation source according to a third embodiment of the present invention.

FIG. 8 shows an evaporation source 29 according to a third embodiment of the present invention. A magnetic field generating means 27 of the evaporation source 29 comprises an in-diametral annular magnet 30 constituted and arranged similarly to the annular magnet 7 according to the first embodiment and an out-diametral annular magnet 31 arranged on the out-diametral side. The out-diametral annular magnet 31 is an annular magnet having magnetic poles on both ends in an axial direction, similar to the in-diametral annular magnet 30, axial thickness of which is substantially similarly constituted. The out-diametral annular magnet 31 is arranged coaxial with the in-diametral annular magnet 30 to surround the in-diametral annular magnet 30 so that the same magnetic poles are directed in the same direction.

As shown in FIG. 8, according to the magnetic field generating means 27 constructed as described above, the number of lines of magnetic force extending through the evaporation material 3 increases more than that of only the in-diametral magnet 30 owing to interaction of both the annular magnets 30 and 31. That is, the magnetic field strength in the evaporation surface 11 increases, and the effect for reducing the molten particles is obtained more strongly.

Figure 9A:
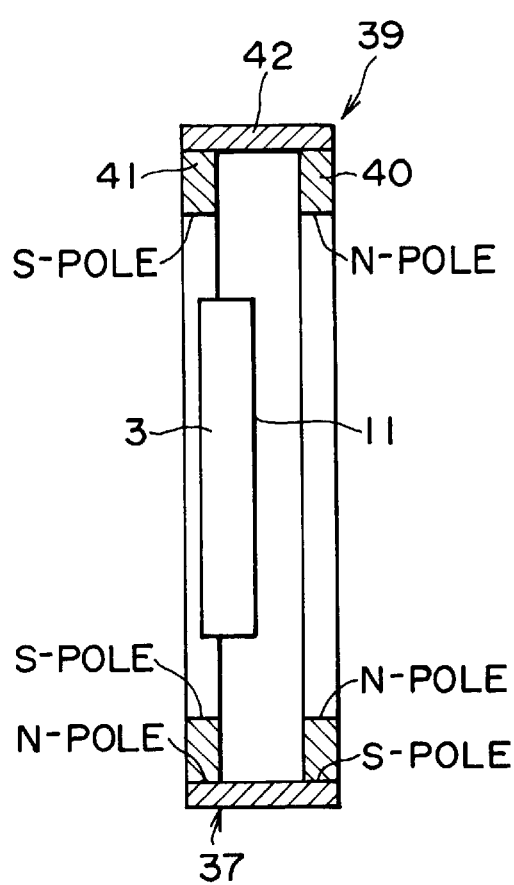
FIGS. 9a and 9b show respectively evaporation sources according to a fourth embodiment of the present invention, 9a being a sectional side view, 9b being a front view.
Figure 9B:
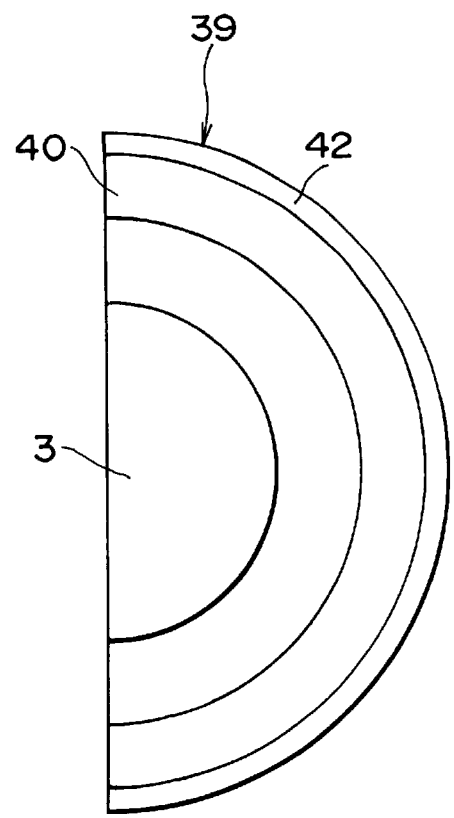

FIG. 9 shows an evaporation source 39 according to a fourth embodiment of the present invention. A magnetic field generating source 37 of the evaporation source 39 has a first annular magnet 40 having magnetic poles on the inner peripheral side and on the outer peripheral side, and a second annular magnet 41 having magnetic poles on the inner peripheral side and on the outer peripheral side and different in magnetic poles on the inner peripheral side and on the outer peripheral side from the first annular magnet 40. The first annular magnet 40 and the second annular magnet 41 are coaxial and arranged in an axial direction.

More specifically, the first annular magnet 40 has N-pole on the inner peripheral side, and S-pole on the outer peripheral side, the first annular magnet 40 has N-pole on the inner peripheral side, and S-pole on the outer peripheral side. Whereas, the second annular magnet 41 has S-pole on the inner peripheral side, and N-pole on the outer peripheral side. The outer peripheral sides of both the annular magnets 40 and 41 are connected by a magnetic material 42. Since the outer peripheral sides of both the annular magnets 40 and 41 are different in pole, the magnetic material 42 is joined by magnetic forces of both the magnets 40 and 41.

As described above, the annular magnet having magnetic poles annularly can be realized even by the above-described constitution. That is, the magnetic field generated from the inner peripheral sides of both the annular magnets 40 and 41 is substantially similar to the magnetic field generating source 7 according to the first embodiment, and when the evaporation surface 11 of the evaporation material 3 is positioned at an intermediate position between the inner peripheral magnetic poles of both the annular magnets 40 and 41, the magnetic field extends through the evaporation surface 1 substantially vertically.

Further, according to the present embodiment, since the magnetic material 42 connect the outer peripheral sides of both the magnets 40 and 41, the magnetic field is not generated on the outer peripheral side. Accordingly, where a number of evaporation sources 39 are arranged, as a unit, adjacent to one another in the vacuum container 2, the influence of the magnetic field on the evaporation sources 39 adjacent to one another can be effectively eliminated.

Figure 10A:
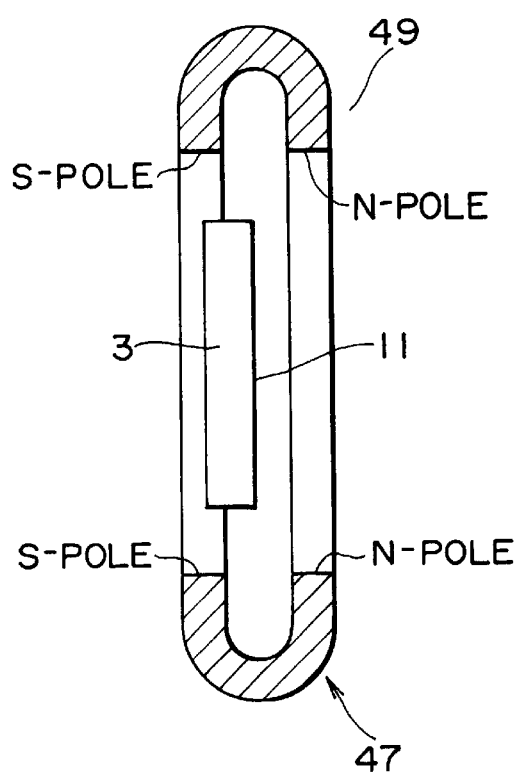
FIGS. 10a and 10b show respectively evaporation sources according to a fifth embodiment of the present invention, 10a being a sectional side view, 10b being a front view.
Figure 10B:
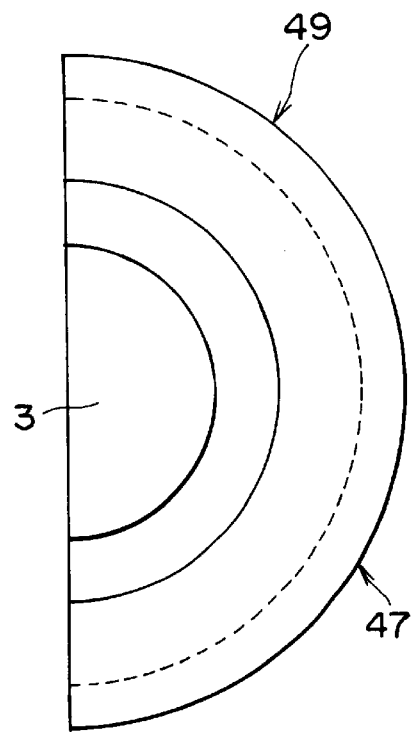

FIG. 10 shows an evaporation source 49 according to a fifth embodiment of the present invention. Annular magnets having a U-shape in section having both N and S magnetic poles on the in-diametral side constitute a magnetic field generating source 47 of the evaporation source 49. Also in the present embodiment, the evaporation material 3 is arranged so that the evaporation surface 11 is positioned at an intermediate position between both the magnetic poles, and the operation and effect similar to the fourth embodiment can be obtained.

It is noted that the present invention is not limited to the above-described embodiments. For example, the annular magnet that is a magnetic field generating source need not to surround the evaporation material annularly, but it may surround the evaporation material in a polygonal shape.

Figure 11:
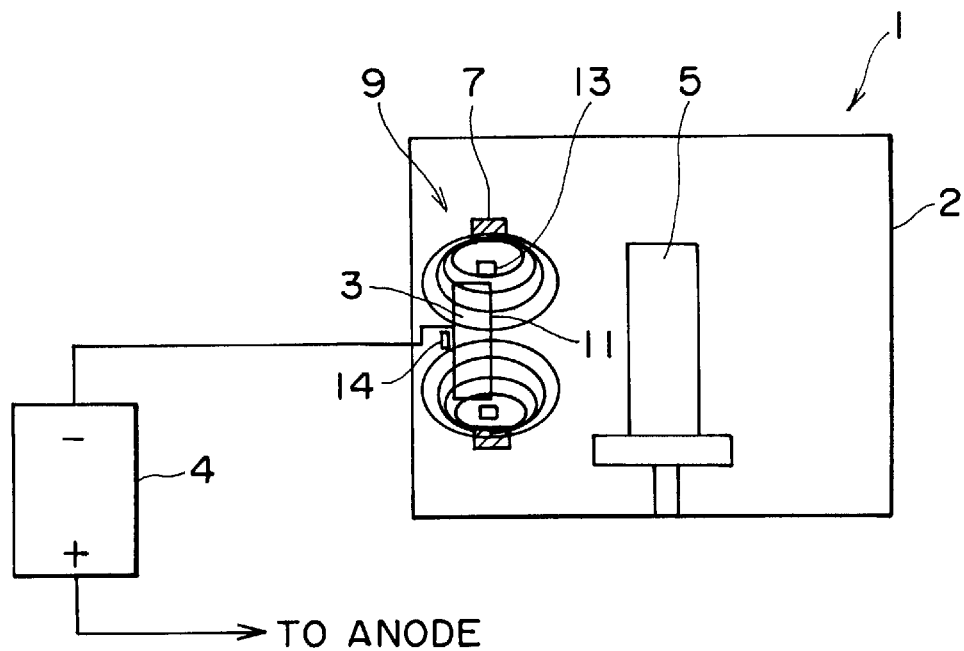
FIG. 11 is a schematic constituent view of a vacuum arc vapor deposition apparatus according to a sixth embodiment of the present invention.

FIG. 11 shows a vacuum vapor deposition apparatus according to a sixth embodiment of the present invention. The vacuum vapor deposition apparatus is constituted so that an arc evaporating source 9 having an evaporation material 3 as a cathode is provided within a vacuum container 2, an arc discharge is generated between the former and an anode by an arc discharge power supply 4 to evaporate and ionize the evaporation material 3, and films are accumulated on a coating substance to be processed (substrate) 5.

Figure 12:
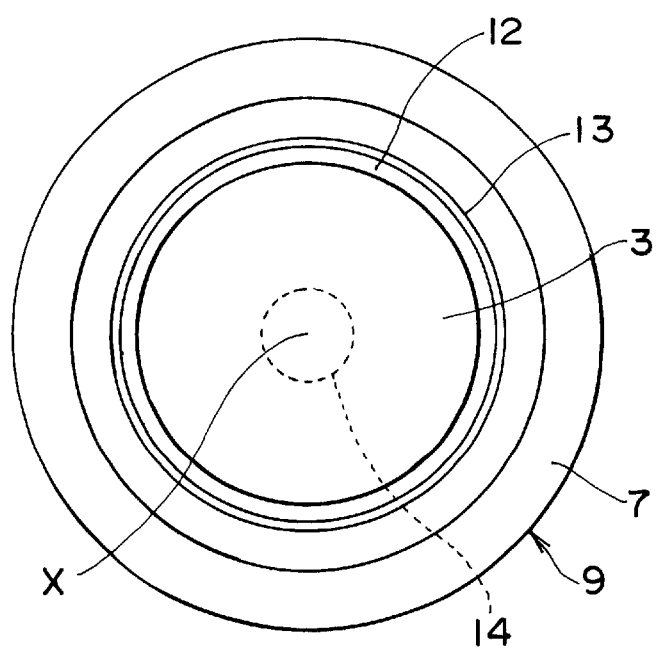
FIG. 12 is a front view of an evaporation source according to a sixth embodiment of the present invention.

As shown in FIG. 12, the evaporating source 9 has a disk-like evaporation material (a target) 3, a ring-like magnetic field generating source 7 arranged in coaxial with a center axis X of the evaporation material, a ring-like magnetic material 13 arranged leaving a small clearance 12 capable of maintaining insulation in the outer periphery of the evaporation material 3 on the inner peripheral side of the magnetic field generating source 7, and a magnet (a line of magnetic force direction changing means) 14 arranged in a central portion on the back side (opposite to the evaporation surface 11) of the evaporation material 3.

Shapes of the evaporation material 3 that can be employed are square other than disk-like. In this case, it is preferable for the magnetic field generating source 7 and the magnetic material 13 to employ a square ring shape instead of a circular ring.

The magnetic field generating source 7 is formed from a ring-like permanent magnet having magnetic poles on both ends in an axial direction X, and is arranged so as to surround the evaporation material. The magnetic field generating source 7 has N-pole on the end (forward surface) on the coating substance to be processed 5 side, and S-pole on the other end. The arrangement of magnetic poles may be reversed.

The ring-like magnetic material 13 is formed of, for example, carbon steel material, and is arranged so that an end 13a on the substance to be processed 5 side substantially faces to the evaporation surface 11.

The magnet (a fourth magnet) 14 as the line of magnetic force direction changing means is a permanent magnet, whose substance to be processed 5 side in an axial direction is S-pole, and the opposite side in an axial direction is N-pole. The magnetic poles of the magnetic field generating source 7 and the magnet 14 are provided oppositely as described above. Accordingly, if the magnetic poles of the magnetic field generating source 7 are reversed to those previously mentioned, the magnetic poles of the magnet 14 are also arranged reversely.

Figure 13:
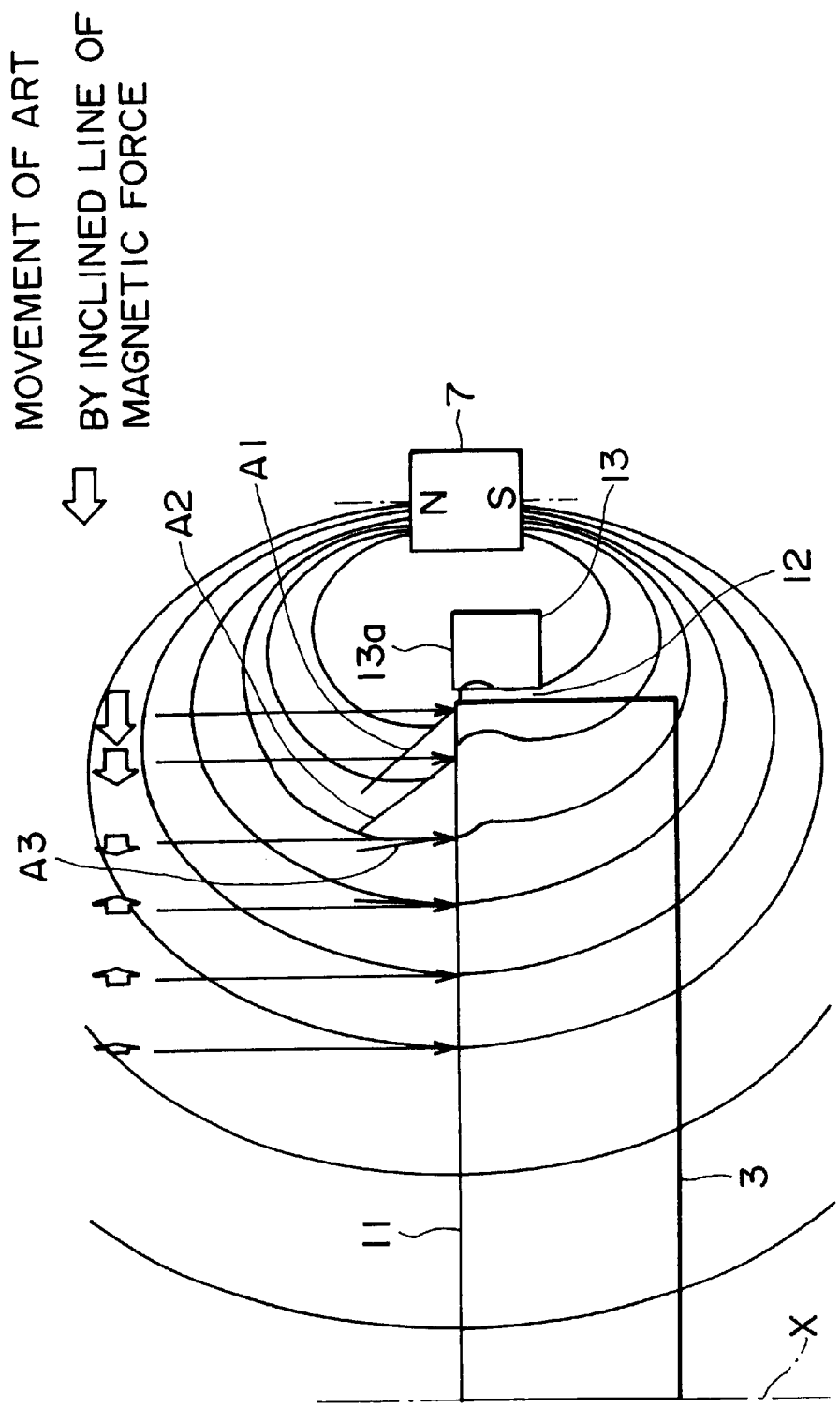
FIG. 13 is a sectional view showing a change of lines of magnetic force caused by an annular magnetic material surrounding the outer periphery of the evaporation material.

When the magnetic material 13 is provided, the line of magnetic force in FIG. 2 is as shown in FIG. 13. That is, out of the lines of magnetic force formed by the magnetic field generating source 7, those extending through the vicinity of the outer peripheral edge of the evaporation surface are drawn into the magnetic material 13 through which the lines of magnetic force tend to pass. Therefore, in the outer peripheral portion of the evaporation surface 11 are to be formed lines of magnetic force inclined to the central portion of the evaporation surface relative to the normal line of the evaporation surface 11. A1 to A3 designate a tangential direction of a line of magnetic force at a point in which the line of magnetic force crosses the evaporation surface 11, from which is understood that the inclination of the lines of magnetic force to the central portion is large closer to the outer periphery side of the evaporation surface.

In this manner, the lines of magnetic force inclined to the central portion side are obtained in the outer peripheral portion of the evaporation surface 11, and the lines of magnetic force near the center are about the same as the case where only the magnetic field generating source 7 is present and substantially vertically cross the evaporation surface. Accordingly, the uniform consumption of the evaporation surface is secured, and the arc spot which approached the outer periphery of the evaporation surface is pushed back in the central direction of the evaporation surface 11 due to the characteristic that the arc tends to move in the inclining direction of lines of magnetic force.

Further, the provision of the magnetic material 12 on the peripheral edge of the evaporation material 3 prevents the repulsion behavior of the arc A relative to the magnetic material 13 as well as the flying-out of the arc A. That is, when the arc A comes close to the magnetic material 13 as shown in FIG. 14b from a position in FIG. 14a, a self-forming magnetic field of the arc A is curved by the magnetic material 13 so that the magnetic material 13 side is high in magnetic flux density while the evaporation material 3 side is low in magnetic flux density. The arc A is pushed back on the evaporation material 3 side which is in the direction of low magnetic flux density due to the properties that the arc A moves in the direction of low magnetic flux density.

Further, as the arc A moves away from the magnetic material 1 and the self-forming magnetic field escapes from a region subject to be affected by the magnetic material 13, the pushing-back force is gradually reduced, and finally, there is not influenced (state of FIG. 14a).

By the operation as described above, confinement of the arc spot is carried out more positively.

Further, the magnetic material 13 and the evaporation material 1 are provided with the clearance 12 therebetween and are electrically insulated, thus positively preventing the arc from moving toward the magnetic material 13.

Figure 15A:
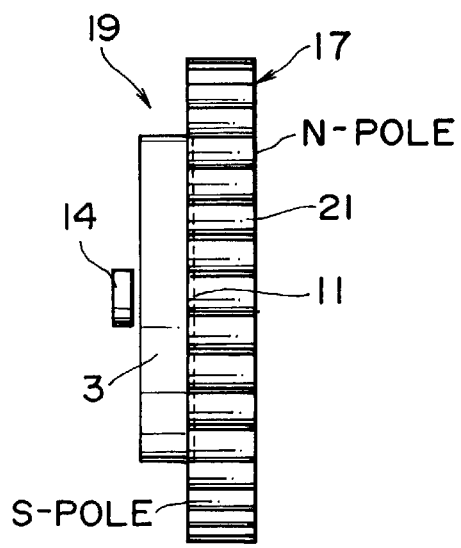
FIGS. 15a and 15b show respectively evaporation sources according to a seventh embodiment of the present invention, 16a being a side view, 15b being a front view.
Figure 15B:
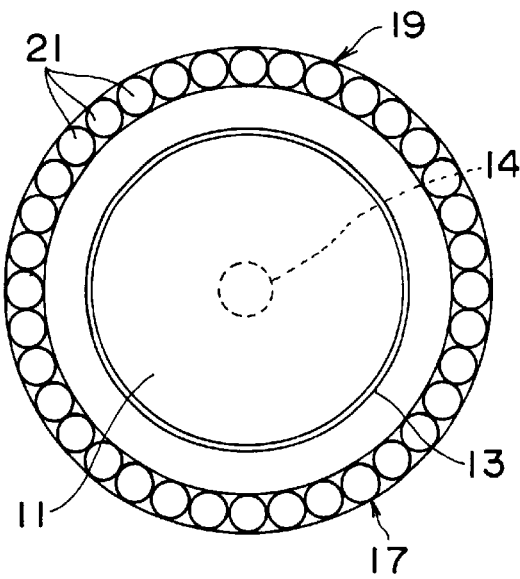

FIG. 15 shows an evaporation source 19 according to a seventh embodiment of the present invention. A magnetic field generating source 17 of the evaporation source 19 is constituted so that a number of permanent magnets are arranged annularly (ring-like) to form a magnetic field similar to the magnetic field generating source 7 according to the first embodiment. That is, a plurality of bar magnets 21 having magnetic poles on both ends in a longitudinal direction are arranged annularly with the directions of the magnetic poles put in order to constitute a ring-like magnet substantially similar to the magnetic field generating source 7 according to the first embodiment.

Figure 16:
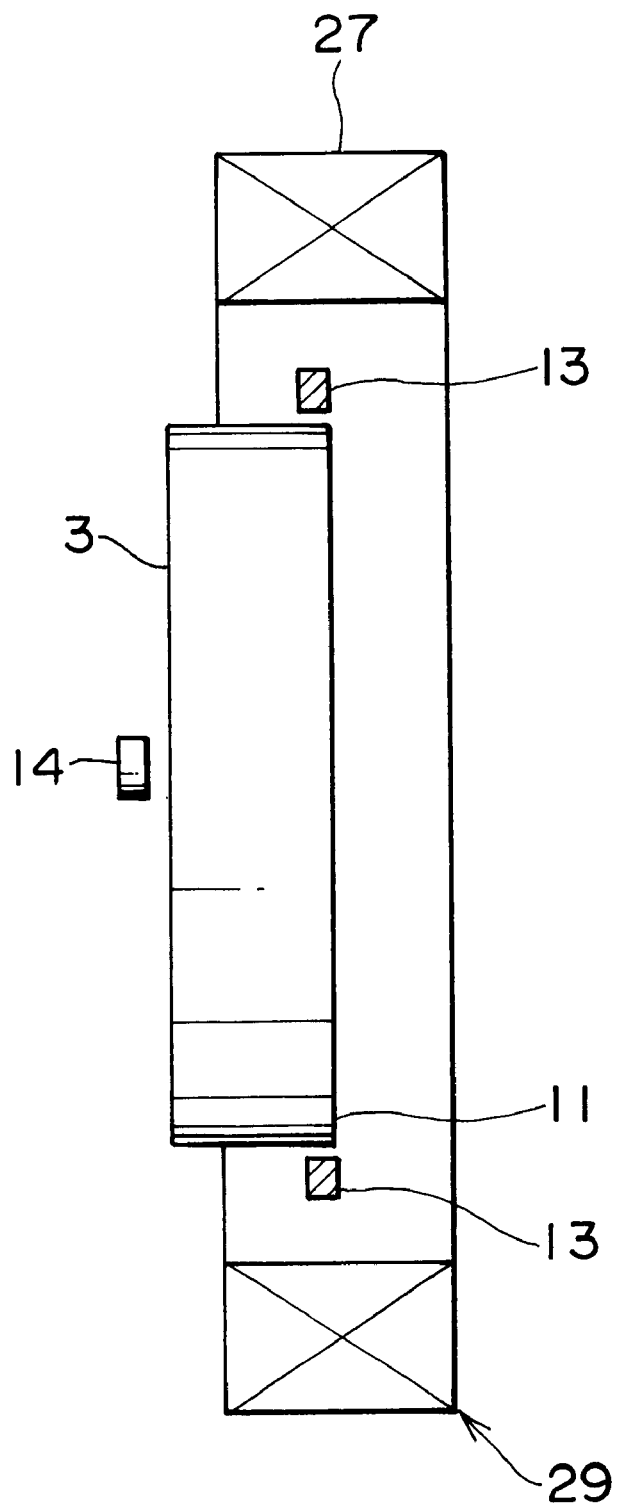
FIG. 16 is a sectional view of an evaporation source according to an eighth embodiment of the present invention.

FIG. 16 shows an evaporation source 29 according to an eighth embodiment of the present invention. A magnetic field generating source 27 of the evaporation source 29 is an air-core coil wound round coaxial with the evaporation material 3.

Figure 17:
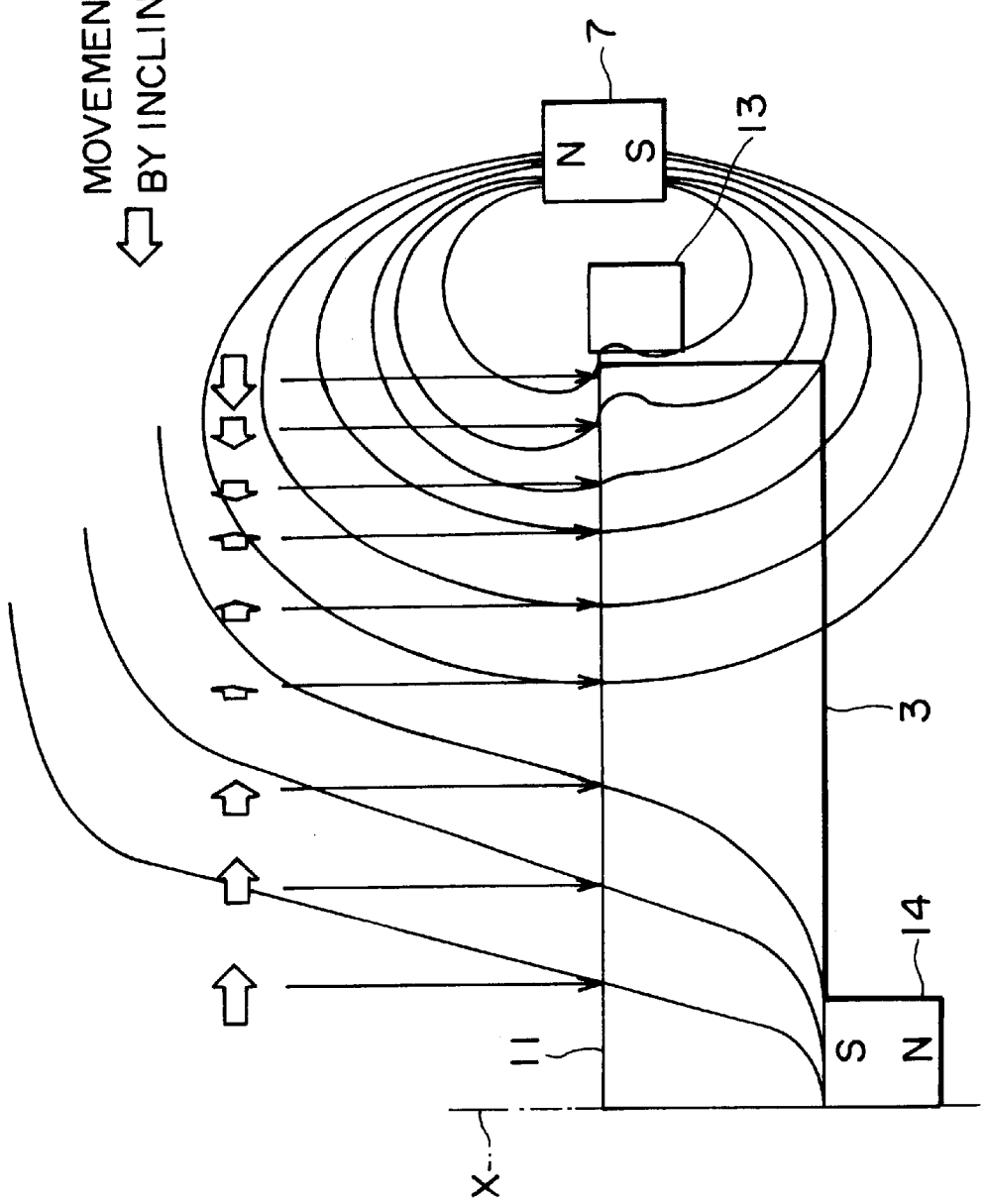
FIG. 17 is a sectional view showing a state of lines of magnetic force where a magnet as a line of magnetic force direction changing means.

FIG. 17 shows a state of lines of magnetic force where a magnet 14 as a line of magnetic force direction changing means is provided on the back of the evaporation material 4. As will be apparent by comparison with FIG. 2, the line of magnetic force extending through the vicinity of the central portion of the evaporation surface 11 is drawn into the magnet 14 to provide outward inclination with respect to the normal line of the evaporation surface 11. Therefore, concentration of the arc on the center of the evaporation surface 11 is prevented due to the characteristic in which the arc tends to move in the inclining direction of the line of magnetic force. Further, since the magnetic flux density in the central portion of the evaporation surface 11 increases due to the presence of the magnet 14, attenuation of magnetic flux density in the central portion as in FIG. 2 is also improved. Thereby, concentration of arcs is prevented, and uniform consumption is achieved.

Figure 18:
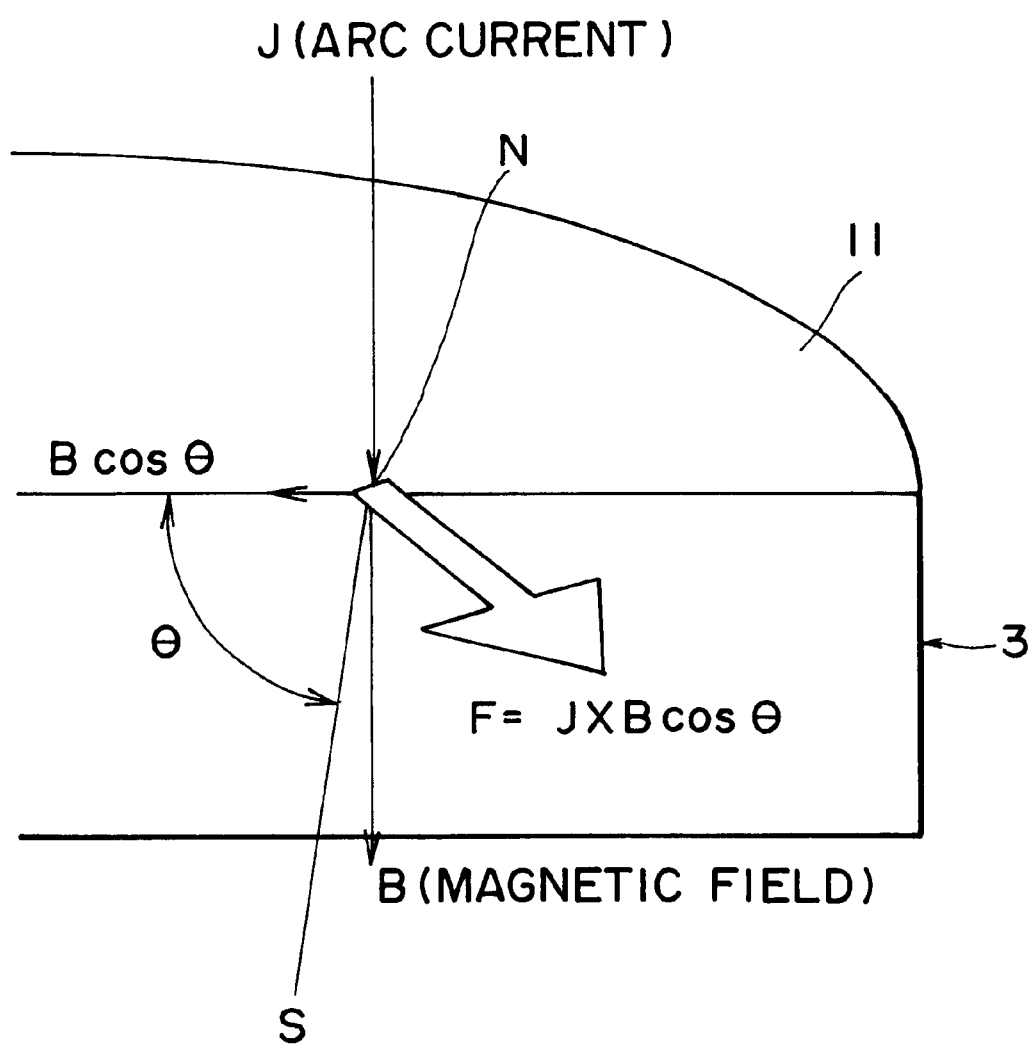
FIG. 18 is a view showing a rotating movement of arc by an inclined line of magnetic force.

As shown in FIG. 18, a line of magnetic force is inclined, and a horizontal magnetic force component is generated on the evaporation surface 11. Suppose here that magnetic flux density of line of magnetic force is B, and an angle formed between the line of magnetic force and the evaporation surface 11 is $\theta$, then the horizontal magnetic force component is $B\cos\theta$.

Due to the characteristic that the arc spot "moves in the direction opposite $j \times B$" (wherein j is an arc current), the force of $F = -j \times B\cos\theta$ shown in FIG. 18 acts on the arc spot so that the arc spot rotates on the evaporation surface 11, but its region is enlarged so that the inclination of the line of magnetic force becomes large, thus making it possible to make moving rate of the arc spot higher in a wide range, as a consequence of which generation of droplets reduces.

It is noted that as the line of magnetic force direction changing means, an electromagnet for generating a similar magnetic field or a coil may be employed other than the permanent magnet. Also in this case, connection will suffice so that the direction of the magnetic pole is not repulsed to the line of magnetic force of the magnetic field generating source 7. Where an electromagnet or a coil is employed, preferably, a control device (not shown) for changing a value of an energizing current to the electromagnet or coil is provided.

By changing the intensity of magnetic force generated by the electromagnet by the control device, it is possible to change the number of lines of magnetic force (magnetic flux density) of the evaporation surface 11 and control a moving area and moving rate of the arc spot on the evaporation surface 11. As a result, arc discharge according to a degree of consumption of a target and demand performance (coarseness of film forming rate) becomes enabled.

Further, the line of magnetic force direction changing means may be a magnetic material. In the case of the magnetic material, only the function of increasing the magnetic flux density in the central portion of the evaporation surface 12 is not present, but the function of inclining the line of magnetic force is similar to the magnet.

What is claimed is:

1. A vacuum arc evaporation source comprising:
   an evaporation material which is a cathode or arc discharge;
   an electrical insulating material between said evaporation material and a magnetic material; and
   a magnetic field generating source which is arranged so as to surround said evaporation material and so that the lines of magnetic force crossing the evaporation surface of said evaporation material cross substantially vertical to said evaporation surface.

2. The vacuum arc evaporation source according to claim 1, wherein the magnetic field generating apparatus is arranged so that said lines of magnetic force are within ±30 degrees with respect to normal line of said evaporation surface.

3. The vacuum arc evaporation source according to claim 1, wherein said evaporation surface is positioned substantially in an intermediate between both magnetic poles N and S of said magnetic field generating source.

4. The vacuum arc evaporation source according to claim 1, wherein said magnetic field generating source has magnetic poles on both ends in an axial direction.

5. The vacuum arc evaporation source according to claim 4, further comprising:
   a magnetic material surrounding the outer periphery of said evaporation material; and
   a magnet provided on the back side of a central portion of said evaporation material and having magnetic poles in an axial direction so that the polarities of said magnet and said magnetic field generating source are directed oppositely to each other.

6. The vacuum arc evaporation source according to claim 1, further comprising a magnetic material surrounding the outer periphery of said evaporation material.

7. The vacuum arc evaporation source according to claim 1, further comprising:
   a magnet for changing the direction of the lines of magnetic force provided on the back side of a central portion of said evaporation material to change the direction of lines of magnetic line crossing in the vicinity of a central portion of said evaporation material to a direction inclined outward to the peripheral edge with respect to normal line formed on the evaporation surface.

8. The vacuum arc evaporation source according to claim 1, wherein said magnetic field generating source is permanent magnet.

9. A vacuum arc evaporation source comprising:
   an evaporation material which is a cathode or arc discharge; and
   a magnetic field generating source which is arranged so as to surround said evaporation material and so that the lines of magnetic force crossing the evaporation surface of said evaporation material cross substantially vertical to said evaporation surface, wherein said magnetic field generating source comprises an in-diametral magnetic field generating source surrounding said evaporation material, and an out-diametral magnetic field generating source so that same axial and same pole as said in-diametral magnetic field generating source are directed in the same direction.

10. A vacuum arc evaporation source comprising:
    an evaporation material which is a cathode or arc discharge; and
    a magnetic field generating source which is arranged so as to surround said evaporation material and so that the lines of magnetic force crossing the evaporation surface of said evaporation material cross substantially vertical to said evaporation surface, wherein said magnetic field generating source comprises a first magnetic field generating source having magnetic poles on the inner peripheral side and on the outer peripheral side, and
    a second magnetic field generating source in which magnetic poles on the inner peripherical side and on the outer peripheral side are different from those of the first magnetic field generating source, said second source being juxtaposed in an axial direction of said first magnetic field generating source.

* * * * *